United States Patent
Hikiji et al.

(10) Patent No.: US 11,471,951 B2
(45) Date of Patent: Oct. 18, 2022

(54) CUTTING TOOLS

(71) Applicant: Sumitomo Electric Hardmetal Corp., Itami (JP)

(72) Inventors: Masahito Hikiji, Itami (JP); Susumu Okuno, Itami (JP); Takato Yamanishi, Itami (JP)

(73) Assignee: SUMITOMO ELECTRIC HARDMETAL CORP., Itami (JP)

( * ) Notice: Subject to any disclaimer, the term of this patent is extended or adjusted under 35 U.S.C. 154(b) by 0 days.

(21) Appl. No.: 17/439,407

(22) PCT Filed: Mar. 22, 2021

(86) PCT No.: PCT/JP2021/011652
§ 371 (c)(1),
(2) Date: Sep. 15, 2021

(65) Prior Publication Data
US 2022/0297199 A1 Sep. 22, 2022

(51) Int. Cl.
*B23B 27/14* (2006.01)
*C23C 16/02* (2006.01)
(Continued)

(52) U.S. Cl.
CPC .............. *B23B 27/148* (2013.01); *B23C 5/16* (2013.01); *C23C 16/0272* (2013.01);
(Continued)

(58) Field of Classification Search
CPC . B23B 27/14; B23B 27/148; B23B 2228/105; B23C 5/16; C23C 16/403
(Continued)

(56) References Cited

U.S. PATENT DOCUMENTS

| 5,487,625 A | 1/1996 | Ljungberg et al. |
| 2002/0122701 A1 | 9/2002 | Ljungberg et al. |

(Continued)

FOREIGN PATENT DOCUMENTS

| JP | 6-316758 A | 11/1994 |
| JP | 2002-205205 A | 7/2002 |

(Continued)

OTHER PUBLICATIONS

Notice of Allowance dated Feb. 11, 2022, in corresponding U.S. Appl. No. 17/439,417, 19 pages.

(Continued)

*Primary Examiner* — Archene A Turner
(74) *Attorney, Agent, or Firm* — Xsensus LLP

(57) ABSTRACT

A cutting tool comprising a base material and a coating arranged on the base material; wherein: the coating comprises an $\alpha\text{-}Al_2O_3$ layer composed of a plurality of $\alpha\text{-}Al_2O_3$ particles; the average particle diameter a of the $\alpha\text{-}Al_2O_3$ particles in a first region of the $\alpha\text{-}Al_2O_3$ layer is 0.10 µm or more and 0.30 µm or less; the average particle diameter b of the $\alpha\text{-}Al_2O_3$ particles in a second region of the $\alpha\text{-}Al_2O_3$ layer is 0.30 µm or more and 0.50 µm or less; the average particle diameter c of the $\alpha\text{-}Al_2O_3$ particles in a third region of the $\alpha\text{-}Al_2O_3$ layer is 0.10 µm or more and 0.30 µm or less; and the ratio b/a is 1.5 or more and 5.0 or less.

5 Claims, 4 Drawing Sheets

(51) Int. Cl.
*B23C 5/16* (2006.01)
*C23C 16/40* (2006.01)
*C23C 16/30* (2006.01)
*C23C 16/34* (2006.01)
*C23C 16/36* (2006.01)

(52) U.S. Cl.
CPC ............ *C23C 16/308* (2013.01); *C23C 16/34* (2013.01); *C23C 16/36* (2013.01); *C23C 16/403* (2013.01); *B23B 2228/105* (2013.01)

(58) Field of Classification Search
USPC .................................................. 428/701, 702
See application file for complete search history.

(56) References Cited

U.S. PATENT DOCUMENTS

| | | | |
|---|---|---|---|
| 2007/0134517 A1 | 6/2007 | Martensson et al. | |
| 2016/0175940 A1 | 6/2016 | Lindahl et al. | |
| 2016/0298232 A1 | 10/2016 | Kang et al. | |
| 2017/0190591 A1* | 7/2017 | Imamura | C23C 16/0272 |
| 2017/0191169 A1 | 7/2017 | Imamura et al. | |
| 2018/0339415 A1* | 11/2018 | Yoshimura | C23C 16/36 |
| 2020/0122239 A1 | 4/2020 | Kodama et al. | |
| 2022/0032380 A1* | 2/2022 | Okuno | B23B 51/00 |

FOREIGN PATENT DOCUMENTS

| | | | |
|---|---|---|---|
| JP | 2004-291162 A | | 10/2004 |
| JP | 2007-136666 A | | 6/2007 |
| JP | 2013-94853 A | | 5/2013 |
| JP | 2013-111720 A | | 6/2013 |
| JP | 2013-111722 | * | 6/2013 |
| JP | 2013-129030 | * | 7/2013 |
| JP | 2013-129030 A | | 7/2013 |
| JP | 2013-188833 A | | 9/2013 |
| JP | 2016-137564 A | | 8/2016 |
| KR | 2016-0080609 | * | 7/2016 |
| WO | 2017/037797 A1 | | 3/2017 |
| WO | 2019/004018 A1 | | 1/2019 |
| WO | 2020/170571 A1 | | 8/2020 |

OTHER PUBLICATIONS

International Search Report and Written Opinion dated Jun. 1, 2021, received for PCT Application PCT/JP2021/011652, Filed on Mar. 22, 2021, 16 pages including English Translation.

U.S. Notice of Allowance dated Feb. 25, 2022 in U.S. Appl. No. 17/439,410, 20 pages.

Notice of Allowance dated Aug. 10, 2022 in corresponding U.S. Appl. No. 17/439,410, 29 pages.

Notice of Allowance dated Feb. 11, 2022 in corresponding U.S. Appl. No. 17/439,410, 19 pages.

* cited by examiner

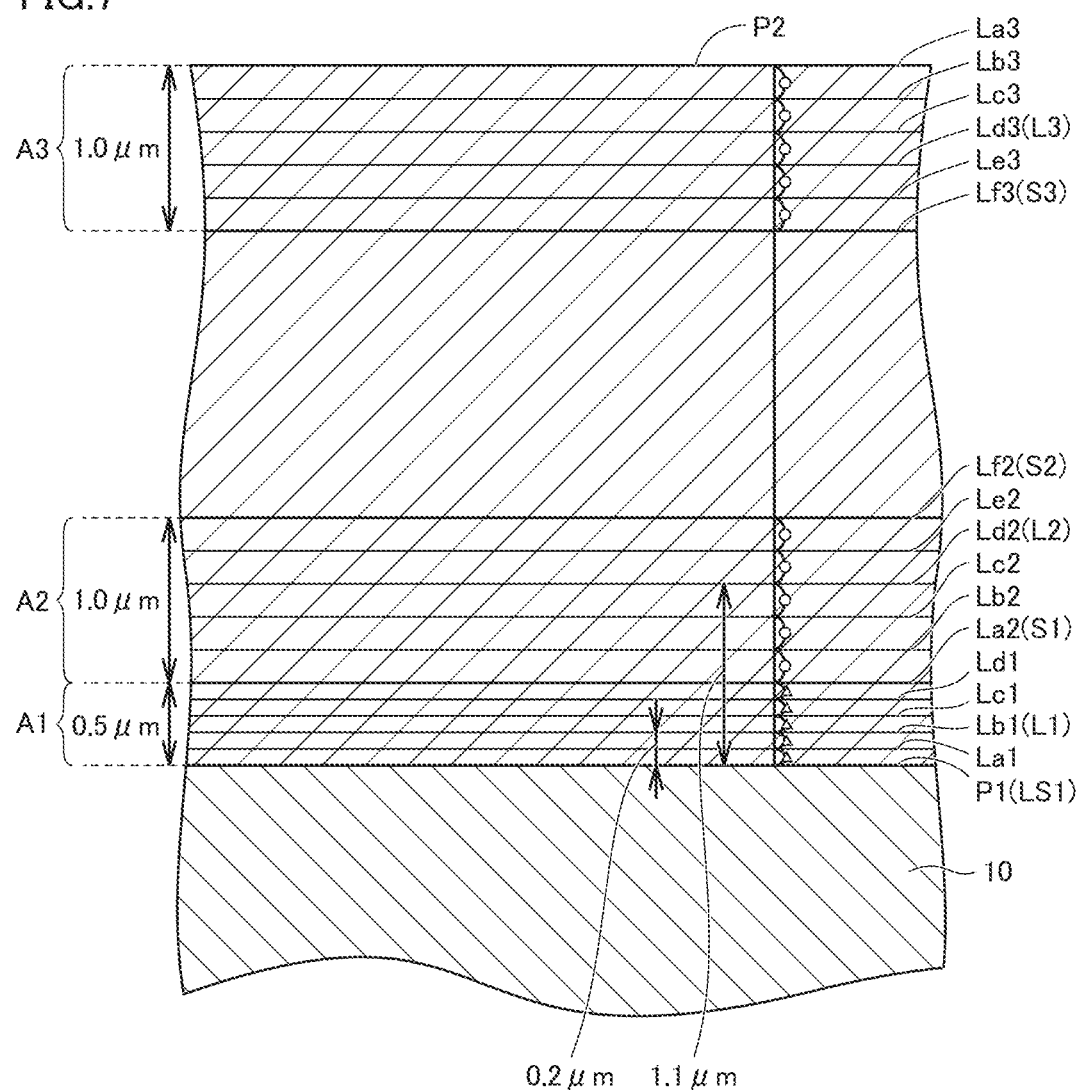

CUTTING TOOLS

CROSS-REFERENCE TO RELATED APPLICATION

The present application is based on PCT filing PCT/JP2021/011652, filed Mar. 22, 2021, the entire contents of which are incorporated herein by reference. This application is also related to U.S. patent application Ser. No. 17/439,410, entitled Cutting Tools, filed on Sep. 15, 2021, and U.S. patent application Ser. No. 17/439,417, entitled Cutting Tools, filed on Sep. 15, 2021, both of which are hereby incorporated by reference.

TECHNICAL FIELD

The present disclosure relates to cutting tools.

BACKGROUND ART

Cutting tools having a coating formed on a base material have been conventionally used. Aluminum oxide having an α-type crystal structure (hereinafter also referred to as "$\alpha\text{-}Al_2O_3$") has been used as a coating material, due to its excellent mechanical properties (see Japanese Patent Laying-Open No. 6-316758 (PTL 1) and Japanese Patent Laying-Open No. 2013-111720 (PTL 2)).

CITATION LIST

Patent Literature

PTL 1: Japanese Patent Laying-Open No. 6-316758
PTL 2: Japanese Patent Laying-Open No. 2013-111720

SUMMARY OF INVENTION

The cutting tool of the present disclosure is a cutting tool comprising a base material and a coating arranged on the base material; wherein:
the coating comprises an $\alpha\text{-}Al_2O_3$ layer;
the $\alpha\text{-}Al_2O_3$ layer is composed of a plurality of $\alpha\text{-}Al_2O_3$ particles;
the $\alpha\text{-}Al_2O_3$ layer comprises a first region, a second region and a third region;
the first region is a region sandwiched between an interface P1 on the base material side of the $\alpha\text{-}Al_2O_3$ layer and a virtual surface S1 that is located at a distance of 0.5 μm from interface P1 toward the surface side of the coating;
the second region is a region sandwiched between virtual surface S1 and a virtual surface S2 that is located at a distance of 1.0 μm from virtual surface S1 toward the surface side of the coating;
the third region is a region sandwiched between a surface P2 of the $\alpha\text{-}Al_2O_3$ layer or an interface P3 on the surface side of the coating of the $\alpha\text{-}Al_2O_3$ layer and a virtual surface S3 that is located at a distance of 1.0 μm from surface P2 or from interface P3 toward the base material side;
the average particle diameter a of the $\alpha\text{-}Al_2O_3$ particles in the first region is 0.10 μm or more and 0.30 μm or less;
the average particle diameter b of the $\alpha\text{-}Al_2O_3$ particles in the second region is 0.30 μm or more and 0.50 μm or less;
the average particle diameter c of the $\alpha\text{-}Al_2O_3$ particles in the third region is 0.10 μm or more and 0.30 μm or less; and
the ratio b/a between the average particle diameter b and the average particle diameter a is 1.5 or more and 5.0 or less.

BRIEF DESCRIPTION OF DRAWINGS

FIG. 7 is a diagram illustrating a method for measuring the average particle diameter of an $\alpha\text{-}Al_2O_3$ layer.

DESCRIPTION OF EMBODIMENTS

Technical Problem

Figure 1:
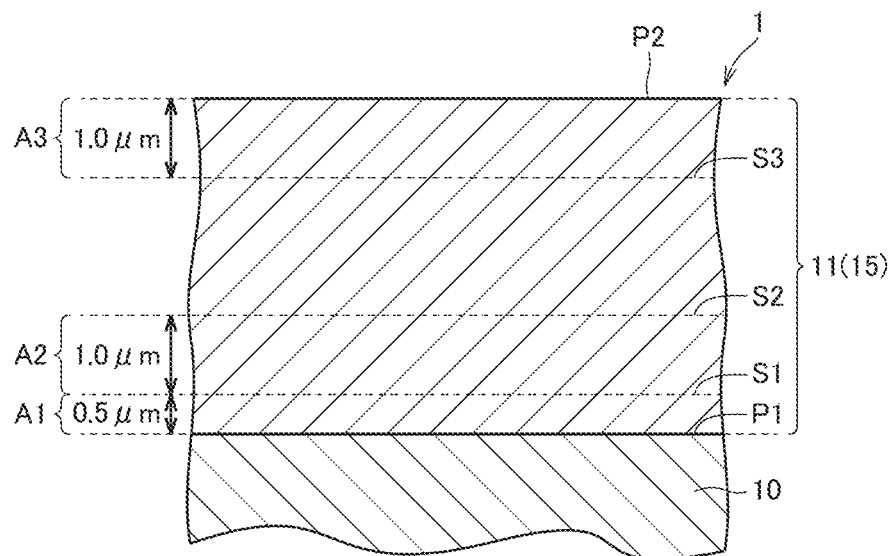
FIG. 1 is a schematic diagram showing an example of a cross section of a cutting tool according to Embodiment 1.

An $\alpha\text{-}Al_2O_3$ layer is excellent in mechanical properties, but requires further improvement in adhesion to the other layers and in fracture resistance. In addition, high-hardness steel also requires further improvement in wear resistance. Therefore, an object of the present disclosure is to provide a tool having a long tool life even in high-efficiency machining of high-hardness steel.

Advantageous Effects of Invention

The cutting tool of the present disclosure can have a long tool life even in high-efficiency machining of high-hardness steel.

DESCRIPTION OF EMBODIMENTS

First, Embodiments of the present disclosure will be listed and illustrated.

(1) The cutting tool of the present disclosure is a cutting tool comprising a base material and a coating arranged on the base material; wherein:
the coating comprises an $\alpha\text{-}Al_2O_3$ layer;
the $\alpha\text{-}Al_2O_3$ layer is composed of a plurality of $\alpha\text{-}Al_2O_3$ particles;
the $\alpha\text{-}Al_2O_3$ layer comprises a first region, a second region and a third region;
the first region is a region sandwiched between an interface P1 on the base material side of the $\alpha\text{-}Al_2O_3$ layer and a virtual surface S1 that is located at a distance of 0.5 μm from interface P1 toward the surface side of the coating;
the second region is a region sandwiched between virtual surface S1 and a virtual surface S2 that is located at a distance of 1.0 μm from virtual surface S1 toward the surface side of the coating;
the third region is a region sandwiched between a surface P2 of the $\alpha\text{-}Al_2O_3$ layer or an interface P3 on the surface side of the coating of the $\alpha\text{-}Al_2O_3$ layer and a virtual surface S3 that is located at a distance of 1.0 μm from surface P2 or from interface P3 toward the base material side;
the average particle diameter a of the $\alpha\text{-}Al_2O_3$ particles in the first region is 0.10 μm or more and 0.30 μm or less;
the average particle diameter b of the $\alpha\text{-}Al_2O_3$ particles in the second region is 0.30 μm or more and 0.50 μm or less;

the average particle diameter c of the α-Al$_2$O$_3$ particles in the third region is 0.10 μm or more and 0.30 μm or less; and the ratio b/a between the average particle diameter b and the average particle diameter a is 1.5 or more and 5.0 or less.

The cutting tool of the present disclosure can have a long tool life even in high-efficiency machining of high-hardness steel.

(2) The average particle diameter c is preferably 0.16 μm or more and 0.24 μm or less. This results in improved wear resistance of the cutting tool.

(3) The ratio b/a is preferably 1.5 or more and 2.5 or less. This results in improved adhesion between the first region and the second region and improved fracture resistance.

(4) The average thickness of the α-Al$_2$O$_3$ layer is 3 μm or more and 15 μm or less. This can result in both excellent wear resistance and fracture resistance at the same time.

(5) The α-Al$_2$O$_3$ layer preferably has a TC (0 0 12) of 3 or more in an orientation index TC (hkl). This results in improved wear resistance of the cutting tool.

DETAILS OF EMBODIMENTS

In order to develop a tool capable of having a long tool life even in high-efficiency machining of high-hardness steel, the present inventors have used the conventional cutting tools described in PTL 1 and PTL 2 to perform high-efficiency machining of high-hardness steel and observe the state of the tools after machining.

The cutting tool in PTL 1 has had a large amount of wear. This has been presumed to be because the cutting tool in PTL 1 has a relatively large particle diameter of the alumina layer of 0.5 μm to 3 μm.

The cutting tool in PTL 2 has tended to easily fracture. This has been presumed to be because the cutting tool in PTL 2 will have a large difference between the particle diameter on the lower side of an alumina layer and that on the surface side of the alumina layer and an interface between crystal particles will thereby occur at the boundary between the lower side and the upper side of the alumina layer, resulting in crack extension starting from the interface.

The present inventors have diligent studies based on the above findings and as a result, have completed a cutting tool of the present disclosure having excellent wear resistance and fracture resistance and having a long tool life. Specific examples of the cutting tool of the present disclosure will be described below with reference to the drawings. In the drawings of the present disclosure, the same reference signs refer to the same parts or equivalent parts. The dimensional relationships among length, width, thickness, depth and the like are changed as appropriate for the purpose of clarifying and simplifying the drawings, and do not necessarily correspond to the actual dimensional relationships.

The expression "A to B" as used herein means the upper and lower limits of the range (that is, A or more and B or less), wherein when the unit is described only for B but not for A, the unit of A is the same as that of B.

In the case of representing a compound or the like by a chemical formula in the present specification, when the atomic ratio is not particularly limited, the formula is intended to include any atomic ratio conventionally known and is not necessarily limited to that in a stoichiometric range. For example, when "TiCN" is described, the ratio of the numbers of atoms constituting TiCN includes any atomic ratio conventionally known.

Embodiment 1: Cutting Tool

The cutting tool of one embodiment of the present disclosure (hereinafter also referred to as "present embodiment") is a cutting tool comprising a base material and a coating arranged on the base material; wherein:

the coating comprises an α-Al$_2$O$_3$ layer;

the α-Al$_2$O$_3$ layer is composed of a plurality of α-Al$_2$O$_3$ particles;

the α-Al$_2$O$_3$ layer comprises a first region, a second region and a third region;

the first region is a region sandwiched between an interface P1 on the base material side of the α-Al$_2$O$_3$ layer and a virtual surface S1 that is located at a distance of 0.5 μm from interface P1 toward the surface side of the coating;

the second region is a region sandwiched between virtual surface S1 and a virtual surface S2 that is located at a distance of 1.0 μm from virtual surface S1 toward the surface side of the coating;

the third region is a region sandwiched between a surface P2 of the α-Al$_2$O$_3$ layer or an interface P3 on the surface side of the coating of the α-Al$_2$O$_3$ layer and a virtual surface S3 that is located at a distance of 1.0 μm from surface P2 or from interface P3 toward the base material side;

the average particle diameter a of the α-Al$_2$O$_3$ particles in the first region is 0.10 μm or more and 0.30 μm or less;

the average particle diameter b of the α-Al$_2$O$_3$ particles in the second region is 0.30 μm or more and 0.50 μm or less;

the average particle diameter c of the α-Al$_2$O$_3$ particles in the third region is 0.10 μm or more and 0.30 μm or less; and the ratio b/a between the average particle diameter b and the average particle diameter a is 1.5 or more and 5.0 or less.

The cutting tool of the present embodiment can have a long tool life even in high-efficiency machining of high-hardness steel. The reasons are not clear but are presumed to be as described below in (i) to (iii).

(i) In the cutting tool of the present embodiment, the average particle diameter a of the α-Al$_2$O$_3$ particles in the first region of the α-Al$_2$O$_3$ layer (hereinafter as referred to as "average particle diameter a of the first region" is as small as 0.10 μm or more and 0.30 μm or less. This results in a large adhesion between the α-Al$_2$O$_3$ layer and a layer in contact with the base material side of the α-Al$_2$O$_3$ layer (hereinafter also referred to as "underlayer") or the base material in contact with the α-Al$_2$O$_3$ layer. Therefore, at the time of cutting, the cutting tool does not easily cause crack extension starting from the interface between the α-Al$_2$O$_3$ layer and the underlayer or the base material and has thereby excellent fracture resistance. In addition, the average particle diameter a of the first region in the above range provides improvement in welding and peeling resistance.

(ii) In the cutting tool of the present embodiment, for the α-Al$_2$O$_3$ layer, the difference between the average particle diameter a of the first region and the average particle diameter b of the α-Al$_2$O$_3$ particles in the second region (hereinafter, also referred to as "average particle diameter b of the second region") is small, and the difference between the average particle diameter b of the second region and the average particle diameter c of the α-Al$_2$O$_3$ particles in the third region (hereinafter, also referred to as "average particle diameter c of the third region") is small. This inhibits interfaces from occurring between the first region and the second region and between the second region and the third region due to the difference in the particle diameters. The α-Al$_2$O$_3$ layer has a large adhesion between the first region and the second region and between the second region and the third region, due to the interfaces, which are the starting point of cracks, being inhibited from occurring, and the cutting tool has thereby excellent fracture resistance.

(iii) The cutting tool of the present embodiment has the particle diameter of the α-Al$_2$O$_3$ particles gradually increasing from the base material side toward the tool surface side in the region of on the base material side of the $\alpha$-$Al_2O_3$ layer. Therefore, the crack propagation distance from the tool surface is long, and cracks on the base material side of the $\alpha$-$Al_2O_3$ layer are inhibited from extending. Accordingly, the cutting tool has excellent fracture resistance.

(iv) In the cutting tool of the present embodiment, the average particle diameter c of the third region of the $\alpha$-$Al_2O_3$ layer is 0.10 µm or more, and cracks are thereby inhibited from extending from the tool surface, so that the cutting tool has excellent fracture resistance. The average particle diameter c is 0.30 µm or less, and the cutting tool thereby has excellent wear resistance.

(v) In the cutting tool of the present embodiment, the ratio b/a between the average particle diameter b of the first region of the $\alpha$-$Al_2O_3$ layer and the average particle diameter a of the second region of the $\alpha$-$Al_2O_3$ layer is 1.5 or more, that is, the average particle diameter b is larger than the average particle diameter a, so that cracks do not easily extend in the first region and the second region in the direction of the thickness of the coating and the cutting tool has thereby excellent fracture resistance. The ratio b/a is 5.0 or less, that is, the difference between the average particle diameter a and the average particle diameter b is small. This inhibits an interface from occurring between the first region and the second region due to the difference in the particle diameters. The $\alpha$-$Al_2O_3$ layer has a large adhesion between the first region and the second region, due to the interfaces, which are the starting point of cracks, being inhibited from occurring, and the cutting tool has thereby excellent fracture resistance.

(vi) As described in (i) to (v) above, the cutting tool of the present embodiment has excellent fracture resistance and wear resistance, and can have a long tool life even in high-efficiency machining of high-hardness steel.

<Configuration of Cutting Tool>

As shown in FIG. 1, a cutting tool 1 of the present embodiment comprises a base material 10 and a coating 15 arranged on base material 10, wherein coating 15 comprises an $\alpha$-$Al_2O_3$ layer 11. Coating 15 preferably coats at least a part of the portion, involved in cutting, of a rake face of the base material, preferably coats at least a part of the portion, involved in cutting, of the base material, and further more preferably coats the entire surface of the base material. The portion, involved in cutting, of the base material means a region, on the surface of the base material, which is at the distance within 1.5 mm from the ridge line of the cutting edge. Even if a part of the base material is not coated with this coating or the configuration of the coating is partly different, it will not deviate from the scope of the present disclosure.

<Applications of Cutting Tool>

Examples of the cutting tools of the present disclosure can include a drill, an end mill (such as a ball end mill), a cutting-edge-replaceable cutting tip for a drill, a cutting-edge-replaceable cutting tip for an end mill, a cutting-edge-replaceable cutting tip for milling a cutting-edge-replaceable cutting tip for turning, a metal saw, a gear cutting tool, a reamer and a tap.

<Base Material>

Base material 10 comprises a rake face and a flank face, and any base material of this type conventionally known may be used. For example, the base material is preferably any one of cemented carbides (for example, WC-based cemented carbides such as WC—Co-based cemented carbides; the cemented carbides can contain a carbonitride of Ti, Ta, Nb or the like), cermets (those that contain TiC, TiN, TiCN or the like as a main component), high-speed steels, ceramics (such as titanium carbide, silicon carbide, silicon nitride, aluminum nitride and aluminum oxide), cubic boron nitride sintered materials and diamond sintered materials.

Among these various base materials, it is preferable to select cemented carbides (particularly WC-based cemented carbides) or cermets (particularly TiCN-based cermets). These base materials have an excellent balance of hardness and strength at a high temperature, and have excellent properties as base materials for cutting tools for the above-described applications. When a WC-based cemented carbide is used as a base material, it may contain a free carbon and an abnormal layer such as that referred to as an η phase or an ε phase in its structure.

The surface of the base material may also be modified. For example, in the case of a cemented carbide, it may have a n-free layer formed on the surface thereof, and in the case of a cermet, it may have a hardened layer formed on the surface. The base material exhibits the desired effect even if its surface is modified.

When the cutting tool is a cutting-edge-replaceable cutting tip, the base material may or may not have a tip breaker. The ridge line of the cutting edge used may have any shape such as a sharp edge shape (one having a ridge where a rake face and a flank face intersect), a honing shape (one having a rounded sharp edge), a negative land shape (a chamfered one), or a combination of a honing shape and a negative land shape.

<Coating>

The coating comprises an $\alpha$-$Al_2O_3$ layer. For example, the coating may comprise a plurality of layers comprising one or more $\alpha$-$Al_2O_3$ layers and the other layer(s).

Coating 15 may comprise the other layer(s) in addition to $\alpha$-$Al_2O_3$ layer 11.

Figure 2:
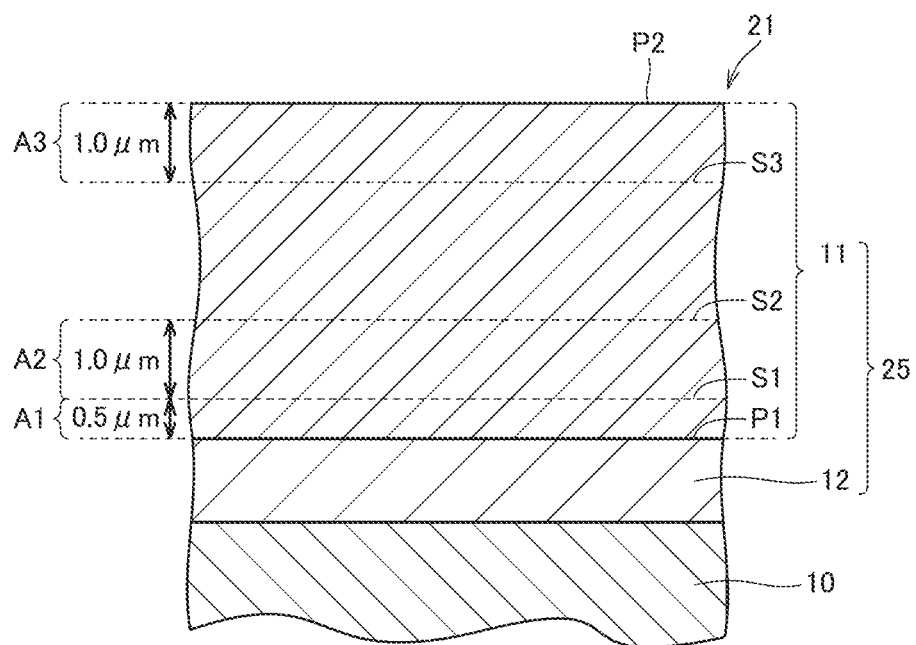
FIG. 2 is a schematic diagram showing another example of a cross section of a cutting tool according to Embodiment 1.

For example, as shown in a cutting tool 21 in FIG. 2, a coating 25 may further comprise an underlayer 12 arranged between base material 10 and $\alpha$-$Al_2O_3$ layer 11.

Figure 3:
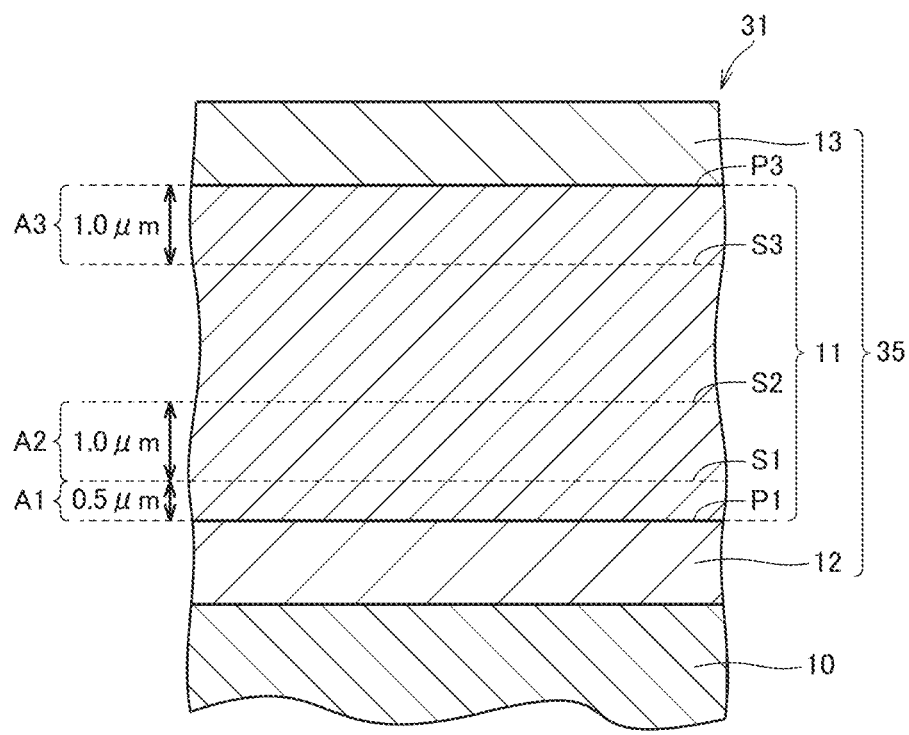
FIG. 3 is a schematic diagram showing another example of a cross section of a cutting tool according to Embodiment 1.

As shown in a cutting tool 31 in FIG. 3, a coating 35 may comprise a surface layer 13 arranged on $\alpha$-$Al_2O_3$ layer 11 in addition to underlayer 12.

Figure 4:
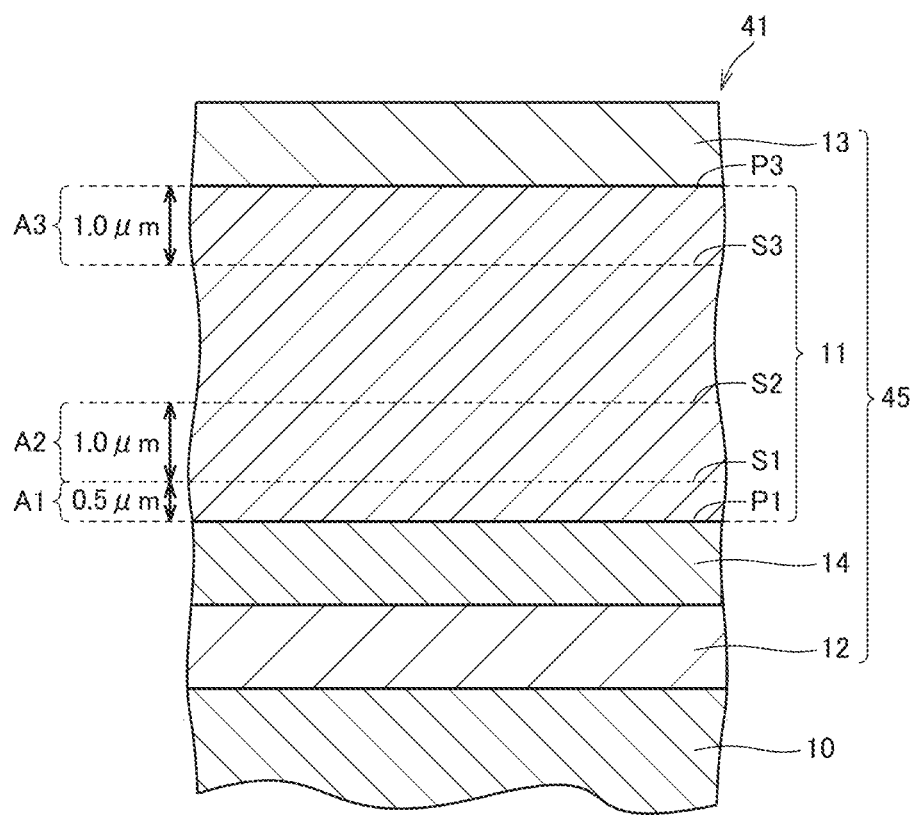
FIG. 4 is a schematic diagram showing another example of a cross section of a cutting tool according to Embodiment 1.

As shown in a cutting tool 41 in FIG. 4, a coating 45 may further comprise an interlayer 14 arranged between underlayer 12 and $\alpha$-$Al_2O_3$ layer 11 in addition to underlayer 12 and surface layer 13. Details of the underlayer, the surface layer and the interlayer will be described later.

The average thickness of the entire coating arranged on the base material is preferably 3 µm or more and 30 µm or less. Such a coating can have excellent wear resistance and peeling resistance. The average thickness of the coating is more preferably 5 µm or more and 25 µm or less and further preferably 8 µm or more and 20 µm or less.

The thickness of the coating described above is measured, for example, by obtaining a cross-sectional sample parallel to the normal direction of the surface of the base material and observing this sample with a scanning transmission electron microscope (STEM). Examples of the scanning transmission electron microscope include JEM-2100F (trade name) manufactured by JEOL Ltd.

As used herein, the term "thickness" means an average thickness. Specifically, the observation magnification for the cross-sectional sample is set to 5000 times, and a rectangular measured field of view that is (30 µm in the direction parallel to the surface of the base material)×(distance including the entire thickness of the coating) is set in the electron microscopic image. The thickness size is measured at 10 points in the field of view, and the average value thereof is defined as "thickness". The thickness and average thickness of the underlayer, the interlayer and the surface layer described below are also measured and calculated in the same manner.

It was confirmed that similar results could be obtained, even when a plurality of measured fields of view covering a coating on the rake face or a coating on the flank face were arbitrarily selected for the same specimen, the above measurement is carried out in the measured fields of view and the above average thickness is calculated.

<$\alpha$-$Al_2O_3$ Layer>

(Configuration of $\alpha$-$Al_2O_3$ Layer)

In the present embodiment, the $\alpha$-$Al_2O_3$ layer is composed of a plurality of $\alpha$-$Al_2O_3$ (aluminum oxide having an $\alpha$-type crystal structure) particles. That is, the $\alpha$-$Al_2O_3$ layer is composed of polycrystalline $\alpha$-$Al_2O_3$. The $\alpha$-$Al_2O_3$ layer may contain unavoidable impurities and the like as long as they exhibit the effects of the present embodiment. That is, the $\alpha$-$Al_2O_3$ layer may contain other components as long as they do not impair the effects of the present disclosure.

In the present embodiment, $\alpha$-$Al_2O_3$ layer 11 arranged on the rake face of base material 10 comprises a first region A1, a second region A2 and a third region A3. First region A1, second region A2 and third region A3 are defined herein as the following regions.

First region A1 is a region sandwiched between interface P1 on the side of base material 10 of $\alpha$-$Al_2O_3$ layer 11 and virtual surface S1 that is located at a distance of 0.5 µm from interface P1 toward the side of surface P2 of coating 15, wherein interface P1 is included in first region A1 and virtual surface S1 is not included in first region A1.

Second region A2 is a region sandwiched between virtual surface S1 and virtual surface S2 that is located at a distance of 1.0 µm from virtual surface S1 toward the side of surface P2 of coating 15, wherein virtual surface S1 and virtual surface S2 are included in second region A2.

When $\alpha$-$Al_2O_3$ layer 11 is arranged on the outermost surface of the coating (for example, as shown in FIGS. 1 and 2), third region A3 is a region sandwiched between surface P2 of $\alpha$-$Al_2O_3$ layer 11 and virtual surface S3 that is located at a distance of 1.0 µm from surface P2 toward the base material side, wherein surface P2 and virtual surface S3 are included in third region A3.

When another layer (surface layer) is arranged on $\alpha$-$Al_2O_3$ layer 11 (for example, as shown in FIGS. 3 and 4), third region A3 is a region sandwiched between interface P3 on the surface side of the coating of the $\alpha$-$Al_2O_3$ layer 11 and virtual surface S3 that is located at a distance of 1.0 µm from interface P3 toward the side of base material 10, wherein interface P3 and virtual surface S3 are included in third region A3.

The second region and the third region may be in contact with each other. Another region may be further arranged between the second region and the third region, wherein another region is a region sandwiched between virtual surface S2 and virtual surface S3.

(Average Particle Diameter of $\alpha$-$Al_2O_3$ Particles)

In the present embodiment, the average particle diameter a of the $\alpha$-$Al_2O_3$ particles in the first region is 0.10 µm or more and 0.30 µm or less; the average particle diameter b of the $\alpha$-$Al_2O_3$ particles in the second region is 0.30 µm or more and 0.50 µm or less; the average particle diameter c of the $\alpha$-$Al_2O_3$ particles in the third region is 0.10 µm or more and 0.30 µm or less; and the ratio b/a between the average particle diameter b and the average particle diameter a is 1.5 or more and 5.0 or less.

When the average particle diameter a of the $\alpha$-$Al_2O_3$ particles in the first region is 0.10 µm or more and 0.30 µm or less, the $\alpha$-$Al_2O_3$ layer has a large adhesion to the layer in contact with the base material side of the $\alpha$-$Al_2O_3$ layer or to the base material in contact with the $\alpha$-$Al_2O_3$ layer. Therefore, at the time of cutting, the cutting tool does not easily cause crack extension starting from the interface between the $\alpha$-$Al_2O_3$ layer and the underlayer or the base material and has thereby excellent fracture resistance. The average particle diameter a is preferably 0.12 µm or more and 0.28 µm or less, more preferably 0.14 µm or more and 0.26 µm or less and further preferably 0.16 µm or more and 0.24 µm or less from the viewpoint of improving adhesion and fracture resistance.

When the average particle diameter b of the $\alpha$-$Al_2O_3$ particles in the second region is 0.30 µm or more, cracks can be inhibited from extending from the tool surface, resulting in improvement in fracture resistance. On the other hand, when the average particle diameter b is 0.50 µm or less, the difference between the average particle diameter b and the average particle diameter a of the $\alpha$-$Al_2O_3$ particles in the first region is small, and an interface is thereby inhibited from occurring between the first region and the second region due to the difference in the particle diameters. Therefore, the cutting tool does not easily cause crack extension starting from the interface and is inhibited from a reduction in the adhesion between the first region and the second region, so that it can have thereby excellent fracture resistance. In addition, the difference between the average particle diameter b of the $\alpha$-$Al_2O_3$ particles in the second region and the average particle diameter c of the $\alpha$-$Al_2O_3$ particles in the third region is small, and an interface is inhibited from occurring between the second region and the third region due to the difference in the particle diameters. Therefore, the cutting tool does not easily cause crack extension starting from the interface and is inhibited from a reduction in the adhesion between the second region and the third region, so that it can have thereby excellent fracture resistance. The average particle diameter b is preferably 0.32 µm or more and 0.48 µm or less, more preferably 0.34 µm or more and 0.46 µm or less and further preferably 0.36 µm or more and 0.44 µm or less from the viewpoint of improving adhesion and fracture resistance.

The average particle diameter c of the $\alpha$-$Al_2O_3$ particles in the third region is 0.10 µm or more, and cracks are thereby inhibited from extending from the tool surface, so that the cutting tool can have excellent fracture resistance. The average particle diameter c is 0.30 µm or less, and the cutting tool can thereby have excellent wear resistance. The average particle diameter c is preferably 0.12 µm or more and 0.28 µm or less, more preferably 0.14 µm or more and 0.26 µm or less and further preferably 0.16 µm or more and 0.24 µm or less.

The ratio b/a between the average particle diameter b and the average particle diameter a is 1.5 or more and 5.0 or less. When the ratio b/a is 1.5 or more, the average particle diameter b is larger than the average particle diameter a, and cracks do not easily extend in the first region and the second region in the direction of the thickness of the coating, so that the cutting tool has excellent fracture resistance. On the other hand, when the ratio b/a is 5 or less, the difference between the average particle diameter a and the average particle diameter b is small, adhesion between the first region and the second region is thereby improved, so that cracks are inhibited from occurring in the first region and the second region. Accordingly, the cutting tool has excellent fracture resistance.

In the present specification, the average particle diameter a, the average particle diameter b, and the average particle diameter c are measured according to the following procedures (A1) to (A8).

(A1) A cutting tool is cut out with a diamond wire along the normal line of a rake face of a base material to expos a cross section of an $\alpha$-$Al_2O_3$ layer. The exposed cross section is subjected to Ar ion milling to make the cross section in a mirror surface state. The conditions for the ion milling are as follows.

Accelerating voltage: 6 kV

Figure 5:
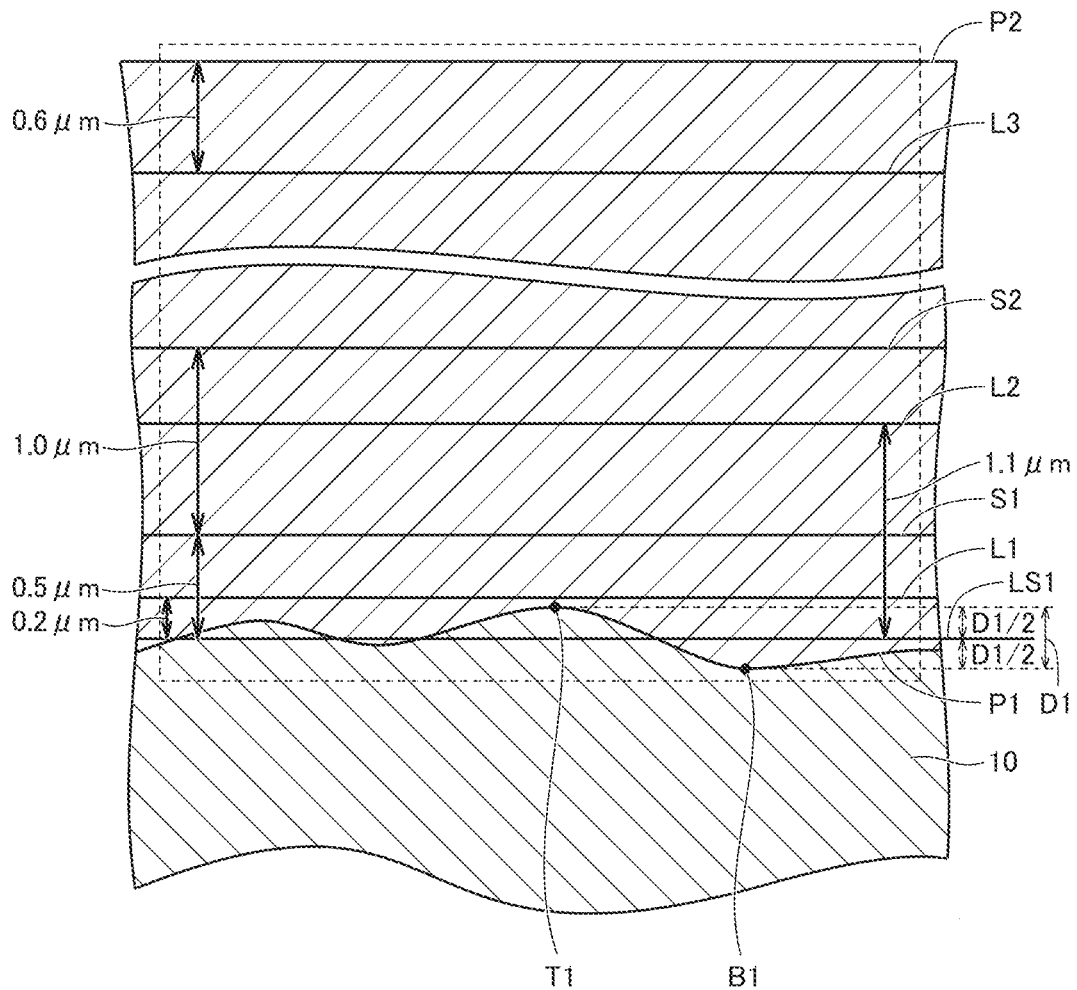
FIG. 5 is a diagram schematically showing an example of a backscattered electron image of an $\alpha\text{-}Al_2O_3$ layer.

Irradiation angle: 0° from the linear direction parallel to the thickness direction of the $\alpha$-$Al_2O_3$ layer in the cross section of the $\alpha$-$Al_2O_3$ layer Irradiation time: 6 hours (A2) The cross section in a mirror surface state is observed with a field-emission scanning electron microscope (EF-SEM) at a magnification of 5000 times to obtain a backscattered electron image (EBSD). FIG. 5 is a diagram schematically showing an example of an EBSD.

(A3) In the above EBSD, a region where a difference D1, of the distances along the normal direction of the rake face, between a bottom portion B1 and a peak portion T1 of the irregularities of interface P1 on the base material side of the $\alpha$-$Al_2O_3$ layer is 0.5 µm or less is identified, and the measurement range is set so that it includes the region. The measurement range is a rectangle that is (the horizontal direction (the direction parallel to the rake face): 30 µm)× (the vertical direction (normal direction of the rake face): length including the entire coating).

(A4) A reference line LS1 is set at a position intermediate between bottom portion B1 and peak portion T1 of interface P1 within the above measurement range.

(A5) The horizontal particle diameters of the $\alpha$-$Al_2O_3$ particles are measured on a line L1 0.2 µm away from reference line LS1 toward the direction of the surface of the cutting tool. The particle diameters of all the $\alpha$-$Al_2O_3$ particles in the measurement range are measured, and the average value thereof is taken as the average particle diameter a of the $\alpha$-$Al_2O_3$ particles in the first region.

(A6) The horizontal particle diameters of the $\alpha$-$Al_2O_3$ particles are measured on a line L2 1.1 µm away from reference line LS1 toward the direction of the surface of the cutting tool. The particle diameters of all the $\alpha$-$Al_2O_3$ particles in the measurement range are measured, and the average value thereof is taken as the average particle diameter b of the $\alpha$-$Al_2O_3$ particles in the second region.

(A7) Within the above measurement range, when the $\alpha$-$Al_2O_3$ layer is arranged on the outermost surface of the coating, the horizontal particle diameters of the $\alpha$-$Al_2O_3$ particles are measured on a line L3 0.6 µm away from surface P2 of the $\alpha$-$Al_2O_3$ layer toward the direction of the base material, or when a surface layer is arranged on the $\alpha$-$Al_2O_3$ layer, the horizontal particle diameters of the $\alpha$-$Al_2O_3$ particles are measured on line L3 0.6 µm away from interface P3 (an interface between the $\alpha$-$Al_2O_3$ layer and the surface layer) on the surface side of the coating of the $\alpha$-$Al_2O_3$ layer toward the direction of the base material. The particle diameters of all the $\alpha$-$Al_2O_3$ particles in the measurement range are measured, and the average value thereof is taken as the average particle diameter c of the $\alpha$-$Al_2O_3$ particles in the third region. When surface P2 and interface P3 have irregularities, line L3 is set at a distance of 0.6 µm away from a line that passes through the bottom portion located closest to the base material side in the measurement range and is parallel to reference line LS1 toward the direction of the base material.

Figure 6:
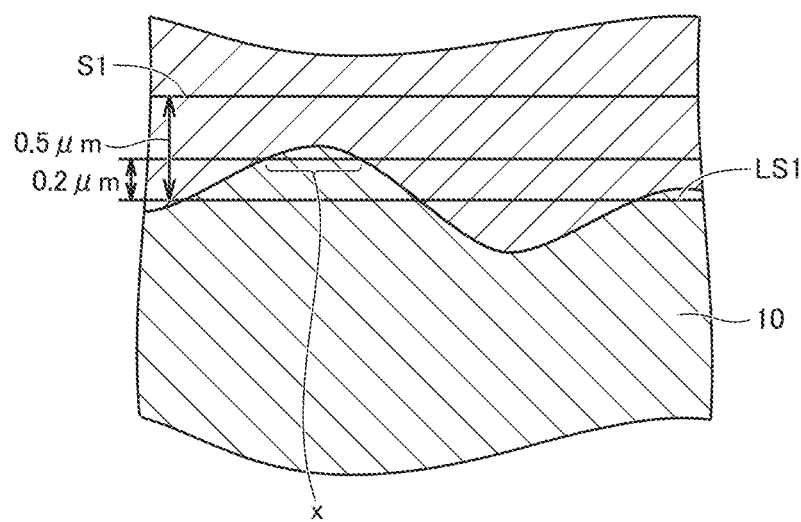
FIG. 6 is a diagram illustrating a method for measuring the average particle diameter of an $\alpha\text{-}Al_2O_3$ layer.

In the above (A5), when the difference between bottom portion B1 and peak portion T1 of the interface is large (for example, 0.5 µm) and line L1 exists inside the base material as shown in FIG. 6, the particle diameters of the $\alpha$-$Al_2O_3$ particles are measured not on line L1 inside the base material (for example, in a region represented by X in FIG. 6) but only for the inside of the $\alpha$-$Al_2O_3$ layer. The average particle diameter a is then calculated.

In setting line L1, the present inventors set lines La1 to Ld1 passing through positions at intervals of 0.1 µm within a range that is at a distance of 0.1 µm or more and less than 0.5 µm from reference line LS1 along the normal direction of the rake face in the first region as shown in FIG. 7; measured the particle diameters of all the $\alpha$-$Al_2O_3$ particles in the measurement range on each line and on interface S1; and calculated the average value thereof. As a result, it was confirmed that when the average particle diameter on a line Lb1 corresponding to line L1 was 0.10 µm or more and 0.30 µm or less, the average particle diameters on lines La1 to Ld1 and interface S1 were also 0.10 µm or more and 0.30 µm or less. This is presumed to be because nucleation in the initial stage is greatly affected by the orientation and irregularities of the underlayer and $Al_2O_3$ crystals thereby grow not in a columnar shape (or in a shape in which the cross-sectional particle diameter increases toward the surface) but in a granular shape (they are grown evenly to some extent perpendicularly and parallel to the interface).

It was confirmed that the similar results could be obtained even if different measurement ranges were arbitrarily selected for the same cutting tool and the above measurement was carried out in the measurement range. In addition, it was confirmed that the similar results could be obtained even if different measurement ranges were arbitrarily selected for the different cutting tool and the above measurement was carried out in the measurement range. Accordingly, the average particle diameter on line L1 of 0.10 µm or more and 0.30 µm or less means the average particle diameter a of the $\alpha$-$Al_2O_3$ particles in the first region of 0.10 µm or more and 0.30 µm or less.

In setting line L2, the present inventors set lines La2 to Lf2 passing through positions at intervals of 0.2 µm within a range that is at a distance of 0.5 µm or more and 1.5 µm or less from reference line LS1 along the normal direction of the rake face in the second region as shown in FIG. 7; measured the particle diameters of all the $\alpha$-$Al_2O_3$ particles in the measurement range on each line; and calculated the average value thereof. As a result, it was confirmed that when the average particle diameter on a line Ld2 corresponding to line L2 was 0.30 µm or more and 0.50 µm or less, the average particle diameters on lines La2 to Lf2 were also 0.30 µm or more and 0.50 µm or less. This is presumed to be for the following reasons. The second region is a transition region from nucleation to crystal growth. In the first region, nucleation occurred under the influence of the orientation, irregularities and the like of the base material in addition to the gas conditions, but in the second region, the influence of gas conditions predominates and the nucleus different (in orientation, shape and the like) from that in the first region predominates. It is presumed that the total number of particles does not change significantly and the change in the particle diameter is not large, because the crystals produced by nucleation are weeded out while stable nuclei are generated under new gas conditions. In addition, in the present disclosure, the gas conditions during forming the first region and the second region are adjusted to gently transition between weeding-out and nucleation of crystals, thereby extending the second region in the thickness direction and maintaining the particle diameter.

It was confirmed that the similar results could be obtained even if different measurement ranges were arbitrarily selected for the same cutting tool and the above measurement was carried out in the measurement range. In addition, it was confirmed that the similar results could be obtained even if different measurement ranges were arbitrarily selected for the different cutting tool and the above measurement was carried out in the measurement range. Accordingly, the average particle diameter on line L2 of 0.30 µm or more and 0.50 µm or less means the average particle diameter b of the α-$Al_2O_3$ particles in the second region of 0.30 µm or more and 0.50 µm or less.

In setting line L3, the present inventors set lines La3 to Lf3 passing through positions at intervals of 0.2 µm within a range that is at a distance of 0 µm or more and 1.0 µm or less from surface P2 of the α-$Al_2O_3$ layer or interface P3 on the surface side of the coating of the α-$Al_2O_3$ layer along the normal direction of the rake face in the third region as shown in FIG. 7; measured the particle diameters of all the α-$Al_2O_3$ particles in the measurement range on each line; and calculated the average value thereof. As a result, it was confirmed that when the average particle diameter on a line Ld3 corresponding to line L3 was 0.10 µm or more and 0.30 µm or less, the average particle diameters on lines La3 to Lf3 were also 0.10 µm or more and 0.30 µm or less. This is presumed to be because the third region is completely a crystal growth region and the change in the number of crystals is small.

It was confirmed that the similar results could be obtained even if different measurement ranges were arbitrarily selected for the same cutting tool and the above measurement was carried out in the measurement range. In addition, it was confirmed that the similar results could be obtained even if different measurement ranges were arbitrarily selected for the different cutting tool and the above measurement was carried out in the measurement range. Accordingly, the average particle diameter on line L3 of 0.10 µm or more and 0.30 µm or less means the average particle diameter c of the α-$Al_2O_3$ particles in the third region of 0.10 µm or more and 0.30 µm or less.

It is confirmed in the cutting tool that when the average particle diameter a of the α-$Al_2O_3$ particles in the first region is 0.10 µm or more and 0.30 µm or less; the average particle diameter b of the α-$Al_2O_3$ particles in the second region is 0.30 µm or more and 0.50 µm or less; the average particle diameter c of the α-$Al_2O_3$ particles in the third region is 0.10 µm or more and 0.30 µm or less; and the ratio b/a between b and a is 1.5 or more and 5.0 or less, the effect is not influenced even if the distance between line L2 and line L3 changes.

Based on the above, the cutting tool of the present embodiment can also be expressed as follows.

The cutting tool of the present disclosure is:

a cutting tool comprising a base material and a coating arranged on the base material;

wherein:

the coating comprises an α-$Al_2O_3$ layer; and the α-$Al_2O_3$ layer is composed of a plurality of α-$Al_2O_3$ particles;

wherein:

in the cross section along the normal line of the surface of the coating, the average particle diameter of the α-$Al_2O_3$ particles, on line L1 that is at the distance of 0.2 µm from reference line LS1 based on the interface between the base material and the α-$Al_2O_3$ layer toward the α-$Al_2O_3$ layer side, is 0.10 µm or more and 0.30 µm or less;

the average particle diameter of the α-$Al_2O_3$ particles, on line L2 that is at the distance of 1.1 µm from reference line LS1 toward the α-$Al_2O_3$ layer side, is 0.30 µm or more and 0.50 µm or less;

the average particle diameter of the α-$Al_2O_3$ particles, on line L3 that is at the distance of 0.6 µm from surface P2 of the α-$Al_2O_3$ layer or from interface P3 on the surface side of the coating of the α-$Al_2O_3$ layer toward the α-$Al_2O_3$ layer side, is 0.10 µm or more and 0.30 µm or less; and the ratio b/a between b and a is 1.5 or more and 5.0 or less. (b/a)

In the cutting tool of the present embodiment, the ratio b/a between the average particle diameter b of the α-$Al_2O_3$ layer in the first region and the average particle diameter a of the α-$Al_2O_3$ layer in the second region is 1.5 or more and 5.0 or less. The ratio b/a is 1.5 or more, that is, the average particle diameter b is larger than the average particle diameter a, so that the cutting tool does not easily extend cracks in the first region and the second region in the direction of its thickness and the cutting tool thereby has excellent fracture resistance. On the other hand, the ratio b/a is 5 or less, that is, the difference between the average particle diameter a and the average particle diameter b is small, so that adhesion between the first region and the second region is improved and cracks are thereby inhibited from occurring in the first region and the second region. Accordingly, the cutting tool has excellent fracture resistance.

From the viewpoint of improving the adhesion between the first region and the second region and improving the fracture resistance, the ratio b/a is preferably 1.5 or more and 2.5 or less, more preferably 1.7 or more and 2.3 or less and further preferably 1.9 or more and 2.1 or less.

(Orientation Index)

In the present disclosure, the α-$Al_2O_3$ layer preferably has a TC (0 0 12) of 3 or more in an orientation index TC (hkl) represented by the following expression (1). The α-$Al_2O_3$ layer having such a TC (0 0 12) can have excellent wear resistance. Accordingly, the cutting tool can have a long tool life.

[Expression 1]

$$TC(hkl) = \frac{I(hkl)}{I_0(hkl)} \left\{ \frac{1}{n} \sum_{1}^{n} \frac{I(hkl)}{I_0(hkl)} \right\}^{-1} \quad (1)$$

In the expression (1), I (hkl) represents the X-ray diffraction intensity on the reflection plane (hkl), and $I_0$ (hkl) represents the standard intensity according to the PDF card No. 00-010-0173 of ICDD. In the expression (1), n represents the number of reflections used in the calculation and is 8 in the present embodiment. The planes (hkl) used for reflection are (012), (104), (110), (0 0 12), (113), (024), (116) and (300).

ICDD (registered trademark) is an abbreviation for International Centre for Diffraction Data. PDF (registered trademark) is an abbreviation for Power Diffraction File.

TC (0 0 12) of the α-Al$_2$O$_3$ layer of the present embodiment can be represented by the following expression (2).

[Expression 2]

$$TC(0\ 0\ 12) = \frac{I(0\ 0\ 12)}{I_0(0\ 0\ 12)} \left\{ \frac{1}{8} \sum_1^8 \frac{I(hkl)}{I_0(hkl)} \right\}^{-1} \quad (2)$$

Accordingly, "TC (0 0 12) of 3 or more in the orientation index TC (hkl)" means that the numerical value determined by the above expression (2) obtained by substituting TC (0 0 12) into the above expression (1) is 3 or more.

The value of TC (0 0 12) is more preferably 4 or more and further preferably 5 or more. The larger the value of TC (0 0 12) is, the more effectively the wear resistance can be improved. The upper limit of the value of TC (0 0 12) is not limited, but since eight reflection planes are used in the calculation, it may be set to 8 or less. The value of TC (0 0 12) can be set to 3 or more and 8 or less, 4 or more and 8 or less, or 5 or more and 8 or less.

In the present disclosure, the α-Al$_2$O$_3$ layer preferably has a TC (110) of 2 or more in an orientation index TC (hkl) represented by the above expression (1). The α-Al$_2$O$_3$ layer having such a TC (110) can have excellent fracture resistance. Accordingly, the cutting tool can have a long tool life.

TC (110) of the α-Al$_2$O$_3$ layer of the present embodiment can be represented by the following expression (3).

[Expression 3]

$$TC(110) = \frac{I(110)}{I_0(110)} \left\{ \frac{1}{8} \sum_1^8 \frac{I(hkl)}{I_0(hkl)} \right\}^{-1} \quad (3)$$

Accordingly, "TC (110) of 2 or more in the orientation index TC (hkl)" means that the numerical value determined by the above expression (3) obtained by substituting TC (110) into the above expression (1) is 2 or more.

The value of TC (110) is more preferably 2.5 or more and further preferably 3 or more. The larger the value of TC (110) (0 0 12) is, the more effectively the fracture resistance can be improved. The upper limit of the value of TC (110) is not limited, but since eight reflection planes are used in the calculation, it may be set to 8 or less. The value of TC (110) can be set to 2 or more and 8 or less, 2.5 or more and 8 or less, or 3 or more and 8 or less.

The TC (hkl) measurement as described above can be performed by analysis with an X-ray diffractometer. TC (hkl) can be measured, for example, using SmartL b/a (registered trademark) (scan speed: 21.7°/min; step: 0.01°; scan range: 15 to) 140° manufactured by Rigaku Corporation under the following conditions. In the present embodiment, the measurement results of TC (hkl) with the X-ray diffractometer are referred to as "XRD results".

Characteristic X-ray: Cu-Kα
Tube voltage: 45 kV
Tube current: 200 mA
Filter: multi-layer mirror
Optical system: concentration method
X-Ray diffraction method: 0-2θ method When using the X-ray diffractometer, the flank face of the cutting tool is irradiated with X-rays. Usually, the rake face has irregularities formed thereon, whereas the flank face has a flat surface. Therefore, it is preferable to irradiate the flank face with X-rays in order to eliminate disturbance factors.

The flank face is irradiated with X-rays particularly on an area that extends in a range of about 2 to 4 mm from a ridge line of a cutting edge. This results in a high reproducibility. In the present embodiment, the values of TC (hkl) of the α-Al$_2$O$_3$ layer on the flank face of the base material are the same as the values of TC (hkl) of the α-Al$_2$O$_3$ layer on the rake face of the base material.

It was confirmed that the similar results could be obtained even if a plurality of measurement areas were arbitrarily selected for the same specimen and the above measurement was carried out for each of the measurement ranges.

(Thickness)

The average thickness of the α-Al$_2$O$_3$ layer is preferably 3 μm or more and 15 μm or less. This can result in both excellent wear resistance and fracture resistance at the same time. The lower limit of the average thickness of the α-Al$_2$O$_3$ layer is preferably 3 μm or more, more preferably 4 μm or more and further more preferably 5 μm or more, from the viewpoint of improving wear resistance. If the average thickness of the α-Al$_2$O$_3$ layer is less than 3 μm, the thickness is insufficient, so that the average particle diameter a, the average particle diameter b, the average particle diameter c, and b/a of the α-Al$_2$O$_3$ layer described above cannot be defined.

The upper limit of the average thickness of the α-Al$_2$O$_3$ layer is preferably 15 μm or less, preferably 10 μm or less, more preferably 9 μm or less and further more preferably 8 μm or more, from the viewpoint of improving fracture resistance. The average thickness of the α-Al$_2$O$_3$ layer is preferably 3 μm or more and 10 μm or less, more preferably 4 μm or more and 9 μm or less and further preferably 5 μm or more and 8 μm or less.

As described above, the thickness of the α-Al$_2$O$_3$ layer can be checked by observing a cross-sectional sample with a scanning transmission electron microscope (STEM) or the like. Then, the observation field of view is the measurement range set in measuring the particle diameter of the α-Al$_2$O$_3$ particles as described above.

It was confirmed that similar results could be obtained, even if a plurality of measurement ranges covering a coating on the rake face or a coating on the flank face were arbitrarily selected for the same specimen and the above measurement was carried out for each of the measurement ranges.

<Other Layers>

The coating may comprise the other layers in addition to the α-Al$_2$O$_3$ layer. As shown in FIGS. 2 to 4, examples of the other layers include underlayer 12, surface layer 13 and interlayer 14.

(Underlayer)

The underlayer is arranged between the base material and the α-Al$_2$O$_3$ layer. Examples of the underlayer include a TiN layer. The TiN layer preferably has an average thickness of 0.1 μm or more and 20 μm or less. This enables the coating to have excellent wear resistance and fracture resistance.

(Surface Layer)

The surface layer preferably contains, for example, any of a carbide, nitride and boride of Ti (titanium) as a main component. The surface layer is a layer arranged on the outermost surface side of the coating. However, the surface layer may not be formed at a ridge line of a cutting edge. The surface layer is arranged, for example, directly above the α-Al$_2$O$_3$ layer.

The expression "contain any of a carbide, nitride and boride of Ti as a main component" means that 90% by mass or more of any of a carbide, nitride and boride of Ti is contained. It also means that the surface layer preferably comprises any of a carbide, nitride and boride of Ti except for unavoidable impurities.

Among carbide, nitride and carbonitride of Ti, a nitride of Ti (that is, a compound represented by TiN) is particularly preferably used as a main component constituting a surface layer. Of these compounds, TiN exhibits the clearest color (exhibits a gold color). Therefore, it has an advantage that it is easy to identify the corners of the cutting tip that have been already used (identify the used area). The surface layer preferably comprises a TiN layer.

The surface layer preferably has an average thickness of 0.05 μm or more and 1 μm or less. This results in improved adhesion between the surface layer and a layer adjacent thereto. The upper limit of the average thickness of the surface layer can be 0.8 μm or less or 0.6 μm or less. The lower limit of the average thickness can be 0.1 μm or more or 0.2 μm or more.

<Interlayer>

The interlayer is arranged between the underlayer and the $\alpha$-$Al_2O_3$ layer. Examples of the interlayer include a TiCN layer and a TiCNO layer. The TiCN layer and the TiCNO layer can impart more suitable wear resistance to the coating due to their excellent wear resistance. The interlayer preferably has an average thickness of 1 μm or more and 20 μm or less. When the interlayer is formed from two or more layers, the average thickness of the interlayer means the average of the total thickness of the two or more layers.

Embodiment 2: Manufacturing Method of Cutting Tool

The cutting tool of Embodiment 1 can be manufactured by forming a coating on a base material by the chemical vapor deposition (CVD) method. When the other layers other than the $\alpha$-$Al_2O_3$ layer is formed in the coating, each of the layers can be formed using a chemical vapor deposition device under the conditions conventionally known. On the other hand, the $\alpha$-$Al_2O_3$ layer can be formed, for example, as follows. The cutting tool of Embodiment 1 is not limited to that manufactured by the following manufacturing method, and may be manufactured by the other manufacturing method.

The film deposition conditions for the $\alpha$-$Al_2O_3$ layer can be, for example, a temperature of 950 to 1050° C., a pressure of 10 to 50 hPa and a gas flow rate (total gas flow rate) of 50 to 100 L/min. The "total gas flow rate" refers to the total volume flow rate of the gas introduced into a CVD furnace per unit time, with a gas in the normal state (0° C., 1 atm) as an ideal gas.

Raw material gases used are $AlCl_3$, HCl, $CO_2$, $H_2S$ and Hz. The proportion of HCl comprised in the raw material gases is varied depending on the thickness of the formed $\alpha$-$Al_2O_3$ layer, from the start of the film deposition. Specifically, it is varied as follows.

From the start of film deposition until the thickness of the $\alpha$-$Al_2O_3$ layer is less than 0.5 μm, the proportions of the raw material gases are such that: HCl is 7.5% by volume or more and 9% by volume or less; $AlCl_3$ is 2% by volume or more and 5% by volume or less; $CO_2$ is 0.1% by volume or more and 6% by volume or less; $H_2S$ is 0.1% by volume or more and 1% by volume or less; and Hz is the balance in % by volume, based on the total of the raw material gases of 100% by volume. The first region is formed in such a manner.

Subsequently, until the thickness of the $\alpha$-$Al_2O_3$ layer is 0.5 μm or more and 1.5 μm or less, the proportions of the raw material gases are set such that: HCl is 6% by volume or more and less than 7.5% by volume; the amount of Hz is increased by a decrement of HCl in the raw material gases as compared with that during forming the first region; and the proportions of the other gases are the same as those during forming the first region. The second region is formed in such a manner.

Subsequently, until the thickness of the $\alpha$-$Al_2O_3$ layer is a thickness 1.0 μm smaller than the final thickness of the $\alpha$-$Al_2O_3$ layer, the proportions of the raw material gases used are the same as those during forming the second region.

Subsequently, from the thickness 1.0 μm smaller than the final thickness of the $\alpha$-$Al_2O_3$ layer to the surface of the $\alpha$-$Al_2O_3$ layer, the proportions of the raw material gases are such that: HCl is 7.5% by volume or more and less than 9.0% by volume; the amount of $H_2$ is decreased by an increment of HCl in the raw material gases as compared with that that during forming the second region; and the proportions of the other gases are the same as those during forming the second region. The third region is formed in such a manner.

HCl has been conventionally used to inhibit $\alpha$-$Al_2O_3$ from being excessively produced during film deposition and to inhibit $\alpha$-$Al_2O_3$ particles from being formed in the gas phase. When $\alpha$-$Al_2O_3$ particles are formed in the gas phase, the $\alpha$-$Al_2O_3$ layer is not easily formed on the base material. On the other hand, it has been thought that a high proportion of HCl in the raw material gases will reduce the film deposition rate. Therefore, it has been common knowledge in the art that the proportion of HCl in the raw material gases should be minimized, and there has been no technical idea to increase the proportion of HCl in the raw material gases.

In contrast to the prior common knowledge in the art, in the present embodiment, the proportion of HCl is varied in order to control the particle diameters of the $\alpha$-$Al_2O_3$ particles as described above. The proportions of HCl in the raw material gases during forming the first region, the second region and the third region are higher than that of HCl in the raw material gases conventionally used during forming an $\alpha$-$Al_2O_3$ layer (for example, 2.8% by volume or more and less than 6% by volume). This results in smaller average particle diameters of the $\alpha$-$Al_2O_3$ particles in the first region, the second region and the third region. This is a finding novelly found by the present inventors. The present inventors have completed the cutting tool of the present embodiments, based on this novel finding.

[Additional Description 1]

The cutting tool of the present disclosure is:

a cutting tool comprising a base material and a coating arranged on the base material;

wherein:

the coating comprises an $\alpha$-$Al_2O_3$ layer; and the $\alpha$-$Al_2O_3$ layer is composed of a plurality of $\alpha$-$Al_2O_3$ particles;

wherein:

in the cross section along the normal line of the surface of the coating, the average particle diameter of the $\alpha$-$Al_2O_3$ particles, on line L1 that is at the distance of 0.2 μm from reference line LS1 based on the interface between the base material and the $\alpha$-$Al_2O_3$ layer toward the $\alpha$-$Al_2O_3$ layer side, is 0.10 μm or more and 0.30 μm or less;

the average particle diameter of the $\alpha$-$Al_2O_3$ particles, on line L2 that is at the distance of 1.1 μm from reference line LS1 toward the $\alpha$-$Al_2O_3$ layer side, is 0.30 μm or more and 0.50 μm or less;

the average particle diameter of the $\alpha$-$Al_2O_3$ particles, on line L3 that is at the distance of 0.6 μm from surface P2 of the α-Al$_2$O$_3$ layer or from interface P3 on the surface side of the coating of the α-Al$_2$O$_3$ layer toward the α-Al$_2$O$_3$ layer side, is 0.10 μm or more and 0.30 μm or less; and the ratio b/a between b and a is 1.5 or more and 5.0 or less.

EXAMPLES

The present embodiments will be more specifically described with reference to Examples. However, the present embodiments are not limited by these Examples.

[Specimens 1 to 28 and Specimens 1-1 to 1-9]

The raw material powders having the formula composition shown in Table 1 were uniformly mixed, pressure molded into a predetermined shape followed by sintering at 1300 to 1500° C. for one to two hours to obtain a base material made of a cemented carbide (shape: model number: CNMG120408N-UX (manufactured by Sumitomo Electric Hardmetal Corp.)). In Table 1, "Balance" indicates that WC comprises the remainder of the formula composition (% by mass).

[Table 1]

TABLE 1

| Formula composition (% by mass) | | | |
|---|---|---|---|
| TaC | NbC | Co | WC |
| 2.0 | 1.0 | 10.0 | Balance |

<Formation of Coating>

A coating was formed on the surface of the base material obtained above to manufacture a cutting tool. Specifically, the base material was set in a chemical vapor deposition device, and a coating was formed on the base material by a chemical vapor deposition method. The configuration of the coating of each of the specimens is as shown in Table 2.

[Table 2]

TABLE 2

| Specimen No. | TiN layer (Underlayer) | TiCN layer (Interlayer) | TiCNO layer (Interlayer) | α-Al$_2$O$_3$ layer | TiN layer (Surface layer) |
|---|---|---|---|---|---|
| 1 | Yes | Yes | Yes | Yes | Yes |
| 2 | Yes | Yes | Yes | Yes | Yes |
| 3 | Yes | Yes | Yes | Yes | Yes |
| 4 | Yes | Yes | Yes | Yes | Yes |
| 5 | Yes | Yes | Yes | Yes | Yes |
| 6 | Yes | Yes | Yes | Yes | Yes |
| 7 | Yes | Yes | Yes | Yes | Yes |
| 8 | Yes | Yes | Yes | Yes | Yes |
| 9 | Yes | Yes | Yes | Yes | Yes |
| 10 | Yes | Yes | Yes | Yes | Yes |
| 11 | Yes | Yes | Yes | Yes | Yes |
| 12 | Yes | Yes | Yes | Yes | Yes |
| 13 | Yes | Yes | Yes | Yes | Yes |
| 14 | Yes | Yes | Yes | Yes | Yes |
| 15 | Yes | Yes | Yes | Yes | Yes |
| 16 | Yes | Yes | Yes | Yes | Yes |
| 17 | Yes | Yes | Yes | Yes | Yes |
| 18 | Yes | Yes | Yes | Yes | Yes |
| 19 | Yes | Yes | Yes | Yes | Yes |
| 20 | Yes | Yes | Yes | Yes | Yes |
| 21 | No | No | No | Yes | Yes |
| 22 | Yes | Yes | Yes | Yes | No |
| 23 | No | No | No | Yes | No |
| 24 | Yes | Yes | Yes | Yes | Yes |
| 25 | Yes | Yes | Yes | Yes | Yes |
| 26 | Yes | Yes | Yes | Yes | Yes |
| 27 | Yes | Yes | Yes | Yes | Yes |

TABLE 2-continued

| Specimen No. | TiN layer (Underlayer) | TiCN layer (Interlayer) | TiCNO layer (Interlayer) | α-Al$_2$O$_3$ layer | TiN layer (Surface layer) |
|---|---|---|---|---|---|
| 28 | Yes | Yes | Yes | Yes | Yes |
| 1-1 | Yes | Yes | Yes | Yes | Yes |
| 1-2 | Yes | Yes | Yes | Yes | Yes |
| 1-3 | Yes | Yes | Yes | Yes | Yes |
| 1-4 | Yes | Yes | Yes | Yes | Yes |
| 1-5 | Yes | Yes | Yes | Yes | Yes |
| 1-6 | Yes | Yes | Yes | Yes | Yes |
| 1-7 | No | No | No | Yes | Yes |
| 1-8 | Yes | Yes | Yes | Yes | No |
| 1-9 | No | No | No | Yes | No |

The following layers are formed on the base material in the order listed: a TiN layer (underlayer), a TiCN layer (interlayer), a TiCNO layer (interlayer), an α-Al$_2$O$_3$ layer and a TiN layer (surface layer). The thickness of the TiN layer (underlayer) is 0.4 μm, the thickness of the TiCN layer (interlayer) is 6.5 μm, the thickness of the TiCNO layer (interlayer) is 0.7 μm, and the thickness of the TiN layer (surface layer) is 0.7 μm. In Table 1, "No" means that the layer in question is not formed for the specimen in question.

Table 3 shows the film deposition conditions for the TiN layer (underlayer), the TiCN layer (interlayer), the TiCNO layer (interlayer) and the TiN layer (surface layer).

[Table 3]

TABLE 3

| | Flow rate of raw material gases (L/min) | Film deposition conditions | |
|---|---|---|---|
| | | Pressure (hPa) | Temperature (° C.) |
| TiN layer (Underlayer) | TiCl$_4$:5, N$_2$:25, H$_2$:70 | 150 | 980 |
| TiCN layer (Interlayer) | TiCl$_4$:10, N$_2$:15, CH$_3$CN:1.5, H$_2$:80 | 100 | 850 |
| TiCNO layer (Interlayer) | TiCl$_4$:0.4, CH$_4$:2.5, CO:0.5, N$_2$: 25, H$_2$:50 | 140 | 970 |
| TiN layer (Surface layer) | TiCl$_4$:5, N$_2$:25, H$_2$:70 | 150 | 1050 |

Table 4 shows the conditions for the film deposition of the α-Al$_2$O$_3$ layer, the composition of the raw material gases and the average thickness of the α-Al$_2$O$_3$ layer for each of the specimens. In Table 4, "Balance" means that H$_2$ gas comprises the remainder of the composition of the raw material gases (% by volume). The conditions for forming the α-Al$_2$O$_3$ layer are a temperature of 1000° C., a pressure of 70 hPa and an introduction rate of the raw material gases (total gas flow rate) of 60 L/min, and a gas pipe for injecting the raw material gases was rotated at 2 rpm while fixing the base material.

[Table 4]

TABLE 4

| Specimen No. | Composition of raw material gases (% by volume) | | | | | | | Film deposition conditions | | | $\alpha$-$Al_2O_3$ layer Average thickness ($\mu$m) |
|---|---|---|---|---|---|---|---|---|---|---|---|
| | $AlCl_3$ | HCl First region | HCl Second region | HCl Third region | $CO_2$ | $H_2S$ | $H_2$ | Pressure (hPa) | Temperature (°C.) | Total gas flow rate (L/min) | |
| 1 | 2.2 | 8.3 | 6.7 | 8.3 | 3.0 | 0.6 | Balance | 70 | 1000 | 60 | 8 |
| 2 | 2.2 | 8.3 | 6.7 | 8.3 | 3.0 | 0.2 | Balance | 70 | 1000 | 60 | 8 |
| 3 | 2.2 | 7.5 | 6.2 | 8.3 | 3.0 | 0.6 | Balance | 70 | 1000 | 60 | 8 |
| 4 | 2.2 | 7.3 | 6.1 | 8.3 | 3.0 | 0.6 | Balance | 70 | 1000 | 60 | 8 |
| 5 | 2.2 | 9.0 | 7.0 | 8.3 | 3.0 | 0.6 | Balance | 70 | 1000 | 60 | 8 |
| 6 | 2.2 | 9.3 | 7.0 | 8.3 | 3.0 | 0.6 | Balance | 70 | 1000 | 60 | 8 |
| 7 | 2.2 | 8.3 | 6.0 | 8.3 | 3.0 | 0.6 | Balance | 70 | 1000 | 60 | 8 |
| 8 | 2.2 | 8.3 | 5.5 | 8.3 | 3.0 | 0.6 | Balance | 70 | 1000 | 60 | 8 |
| 9 | 2.2 | 8.3 | 7.5 | 8.3 | 3.0 | 0.6 | Balance | 70 | 1000 | 60 | 8 |
| 10 | 2.2 | 8.6 | 7.9 | 8.3 | 3.0 | 0.6 | Balance | 70 | 1000 | 60 | 8 |
| 11 | 2.2 | 8.6 | 7.9 | 8.3 | 3.0 | 0.2 | Balance | 70 | 1000 | 60 | 8 |
| 12 | 2.2 | 9.0 | 6.0 | 8.3 | 3.0 | 0.6 | Balance | 70 | 1000 | 60 | 8 |
| 13 | 2.2 | 8.0 | 7.0 | 8.3 | 3.0 | 0.6 | Balance | 70 | 1000 | 60 | 8 |
| 14 | 2.2 | 7.9 | 7.3 | 8.3 | 3.0 | 0.6 | Balance | 70 | 1000 | 60 | 8 |
| 15 | 2.2 | 8.3 | 6.7 | 7.5 | 3.0 | 0.6 | Balance | 70 | 1000 | 60 | 8 |
| 16 | 2.2 | 8.3 | 6.7 | 6.7 | 3.0 | 0.6 | Balance | 70 | 1000 | 60 | 8 |
| 17 | 2.2 | 8.3 | 6.7 | 9.0 | 3.0 | 0.6 | Balance | 70 | 1000 | 60 | 8 |
| 18 | 2.2 | 8.3 | 6.7 | 9.5 | 3.0 | 0.6 | Balance | 70 | 1000 | 60 | 8 |
| 19 | 2.2 | 8.3 | 6.7 | 8.3 | 3.0 | 0.6 | Balance | 70 | 1000 | 60 | 3 |
| 20 | 2.2 | 8.3 | 6.7 | 8.3 | 3.0 | 0.6 | Balance | 70 | 1000 | 60 | 15 |
| 21 | 2.2 | 8.3 | 6.7 | 8.3 | 3.0 | 0.6 | Balance | 70 | 1000 | 60 | 8 |
| 22 | 2.2 | 8.3 | 6.7 | 8.3 | 3.0 | 0.6 | Balance | 70 | 1000 | 60 | 8 |
| 23 | 2.2 | 8.3 | 6.7 | 8.3 | 3.0 | 0.6 | Balance | 70 | 1000 | 60 | 8 |
| 24 | 2.2 | 8.3 | 6.7 | 8.5 | 3.0 | 0.6 | Balance | 70 | 1000 | 60 | 8 |
| 25 | 2.2 | 8.3 | 6.7 | 8.0 | 3.0 | 0.6 | Balance | 70 | 1000 | 60 | 8 |
| 26 | 2.2 | 8.5 | 6.0 | 8.3 | 3.0 | 0.6 | Balance | 70 | 1000 | 60 | 8 |
| 27 | 2.2 | 8.3 | 6.7 | 8.3 | 3.0 | 0.6 | Balance | 70 | 1000 | 60 | 18 |
| 28 | 2.2 | 8.3 | 6.7 | 8.3 | 3.0 | 0.5 | Balance | 70 | 1000 | 60 | 8 |
| 1-1 | 2.2 | 6.7 | 4.5 | 3.5 | 3.0 | 0.6 | Balance | 70 | 1000 | 60 | 8 |
| 1-2 | 2.2 | 8.3 | 4.5 | 3.5 | 3.0 | 0.6 | Balance | 70 | 1000 | 60 | 8 |
| 1-3 | 2.2 | 6.7 | 4.5 | 3.5 | 3.0 | 0.2 | Balance | 70 | 1000 | 60 | 8 |
| 1-4 | 2.2 | 8.3 | 4.5 | 3.5 | 3.0 | 0.2 | Balance | 70 | 1000 | 60 | 8 |
| 1-5 | 2.2 | 8.3 | 4.5 | 3.5 | 3.0 | 0.6 | Balance | 70 | 1000 | 60 | 3 |
| 1-6 | 2.2 | 8.3 | 4.5 | 3.5 | 3.0 | 0.6 | Balance | 70 | 1000 | 60 | 15 |
| 1-7 | 2.2 | 8.3 | 4.5 | 3.5 | 3.0 | 0.6 | Balance | 70 | 1000 | 60 | 8 |
| 1-8 | 2.2 | 8.3 | 4.5 | 3.5 | 3.0 | 0.6 | Balance | 70 | 1000 | 60 | 8 |
| 1-9 | 2.2 | 8.3 | 4.5 | 3.5 | 3.0 | 0.6 | Balance | 70 | 1000 | 60 | 8 |

For example, the film deposition conditions of Specimen 1 are as follows. From the start of film deposition until the thickness of the $\alpha$-$Al_2O_3$ layer was 0.5 nm, the formula composition of the raw material gases used was such that $AlCl_3$ was 2.2% by volume, HCl was 8.3% by volume, $CO_2$ was 3.0% by volume and $H_2S$ was 0.6% by volume with the balance being Hz. The first region was formed in such a manner.

Subsequently, from the thickness of the $\alpha$-$Al_2O_3$ layer above 0.5 μm until the thickness of the $\alpha$-$Al_2O_3$ layer was a thickness 1 μm smaller than the average thickness (8 μm) of the $\alpha$-$Al_2O_3$ layer (7 μm), the composition of the raw material gases having the same formula composition as that during forming the first region was used except that the proportion of HCl in the raw material gases was 6.7% by volume and the proportion of the balance Hz was changed accordingly. The second region was formed in such a manner.

Subsequently, from the thickness 1.0 μm smaller than the final thickness of the $\alpha$-$Al_2O_3$ layer to the surface of the $\alpha$-$Al_2O_3$ layer, the composition of the raw material gases having the same formulas composition as that during forming the second region was used except that the proportion of HCl in the raw material gases was 8.3% by volume and the proportion of the balance Hz was changed accordingly. The third region was formed in such a manner.

<Evaluation of $\alpha$-$Al_2O_3$ Layer>

For the $\alpha$-$Al_2O_3$ layer of each of the specimens, the average particle diameter a of the first region, the average particle diameter b of the second region and the average particle diameter c of the third region, and TC (0 0 12) and TC (110) were measured.

These measurement methods are as shown in Embodiment 1, and they will be thereby not described repeatedly. The results are shown in the columns "Particle diameter a", "Particle diameter b" and "Particle diameter c", and "TC (0 0 12)" and "TC (110)" in Table 5.

Further, the value of b/a was calculated based on the average particle diameter a and the average particle diameter b. The results are shown in the column "b/a" in Table 5.

[Table 5]

TABLE 5

| Specimen No. | α-Al₂O₃ layer ||||||| Cutting evaluation 1 Fracture rate (%) | Cutting evaluation 2 Vb (mm) |
|---|---|---|---|---|---|---|---|---|---|
| | Average thickness (μm) | TC (0 0 12) | TC (110) | Particle diameter a (μm) | Particle diameter b (μm) | Particle diameter c (μm) | b/a | | |
| 1 | 8 | 7.6 | 0.2 | 0.20 | 0.40 | 0.20 | 2.0 | 20 | 0.11 |
| 2 | 8 | 2.4 | 4.6 | 0.20 | 0.40 | 0.20 | 2.0 | 20 | 0.20 |
| 3 | 8 | 7.3 | 0.4 | 0.30 | 0.48 | 0.20 | 1.6 | 50 | 0.11 |
| 4 | 8 | 7.3 | 0.4 | 0.32 | 0.49 | 0.20 | 1.5 | 60 | 0.12 |
| 5 | 8 | 7.2 | 0.3 | 0.10 | 0.35 | 0.20 | 3.5 | 30 | 0.12 |
| 6 | 8 | 7.4 | 0.2 | 0.08 | 0.35 | 0.20 | 4.4 | 60 | 0.11 |
| 7 | 8 | 7.2 | 0.3 | 0.20 | 0.50 | 0.20 | 2.5 | 50 | 0.14 |
| 8 | 8 | 7.2 | 0.3 | 0.20 | 0.60 | 0.20 | 3.0 | 65 | 0.16 |
| 9 | 8 | 7.4 | 0.3 | 0.20 | 0.30 | 0.20 | 1.5 | 50 | 0.10 |
| 10 | 8 | 7.2 | 0.6 | 0.15 | 0.25 | 0.20 | 1.7 | 65 | 0.10 |
| 11 | 8 | 2.6 | 4.1 | 0.15 | 0.25 | 0.20 | 1.7 | 65 | 0.19 |
| 12 | 8 | 7.5 | 0.2 | 0.10 | 0.50 | 0.20 | 5.0 | 55 | 0.13 |
| 13 | 8 | 7.6 | 0.3 | 0.24 | 0.35 | 0.20 | 1.5 | 50 | 0.11 |
| 14 | 8 | 7.6 | 0.3 | 0.25 | 0.33 | 0.20 | 1.3 | 65 | 0.11 |
| 15 | 8 | 7.7 | 0.1 | 0.20 | 0.40 | 0.30 | 2.0 | 15 | 0.20 |
| 16 | 8 | 7.7 | 0.1 | 0.20 | 0.40 | 0.40 | 2.0 | 5 | 0.22 |
| 17 | 8 | 7.4 | 0.3 | 0.20 | 0.40 | 0.10 | 2.0 | 50 | 0.09 |
| 18 | 8 | 7.1 | 0.5 | 0.20 | 0.40 | 0.06 | 2.0 | 60 | 0.07 |
| 19 | 3 | 7.2 | 0.6 | 0.20 | 0.40 | 0.20 | 2.0 | 0 | 0.20 |
| 20 | 15 | 7.7 | 0.1 | 0.20 | 0.40 | 0.20 | 2.0 | 50 | 0.08 |
| 21 | 8 | 7.6 | 0.3 | 0.20 | 0.40 | 0.20 | 2.0 | 15 | 0.13 |
| 22 | 8 | 7.6 | 0.3 | 0.20 | 0.40 | 0.20 | 2.0 | 20 | 0.11 |
| 23 | 8 | 7.7 | 0.3 | 0.20 | 0.40 | 0.20 | 2.0 | 15 | 0.13 |
| 24 | 8 | 7.4 | 0.3 | 0.20 | 0.40 | 0.16 | 2.0 | 30 | 0.10 |
| 25 | 8 | 7.7 | 0.1 | 0.20 | 0.40 | 0.24 | 2.0 | 15 | 0.15 |
| 26 | 8 | 7.2 | 0.3 | 0.17 | 0.50 | 0.20 | 2.9 | 55 | 0.14 |
| 27 | 18 | 7.7 | 0.1 | 0.20 | 0.40 | 0.20 | 2.0 | 55 | 0.06 |
| 28 | 8 | 3.0 | 2.1 | 0.20 | 0.40 | 0.20 | 2.0 | 15 | 0.12 |
| 1-1 | 8 | 7.4 | 0.3 | 0.40 | 0.80 | 1.00 | 2.0 | 80 | 0.30 |
| 1-2 | 8 | 7.5 | 0.2 | 0.20 | 0.80 | 1.00 | 4.0 | 50 | 0.28 |
| 1-3 | 8 | 2.6 | 4.3 | 0.40 | 0.80 | 1.00 | 2.0 | 80 | 0.35 |
| 1-4 | 8 | 2.4 | 4.4 | 0.20 | 0.80 | 1.00 | 4.0 | 50 | 0.33 |
| 1-5 | 3 | 7.5 | 0.2 | 0.20 | 0.80 | 1.00 | 4.0 | 20 | 0.35 |
| 1-6 | 15 | 7.5 | 0.2 | 0.20 | 0.80 | 1.00 | 4.0 | 70 | 0.23 |
| 1-7 | 8 | 7.6 | 0.3 | 0.20 | 0.80 | 1.00 | 4.0 | 45 | 0.35 |
| 1-8 | 8 | 7.7 | 0.3 | 0.20 | 0.80 | 1.00 | 4.0 | 50 | 0.33 |
| 1-9 | 8 | 7.7 | 0.3 | 0.20 | 0.80 | 1.00 | 4.0 | 45 | 0.35 |

<Cutting Evaluation 1>

A cutting test was performed under the following cutting conditions 1 using each of the cutting tools obtained above. For twenty different cutting edges, cutting was performed with each of the cutting edges for 20 seconds, and each of the cutting edges was checked for the presence or absence of fracture(s), wherein "fracture" means that a chip(s) of 500 μm or more is (are) observed. The proportion of the cutting edges having the fracture(s) occurring of the twenty cutting edges was calculated to obtain the fracture rate (%). That is, the fracture rate (%)=(number of cutting edges having the fracture(s) occurring/20)×100. When the fracture rate is 55% or less, the cutting tool is judged to have excellent fracture resistance and to have a long tool life. The results are shown in the column "Cutting evaluation 1—Fracture rate (%)" in Table 5.

(Cutting Conditions 1)
Material to be cut: SCM440 (grooved round bar)
Machining: intermittent turning of the outer diameter of a grooved round bar
Cutting speed: 120 m/min
Feed amount: 0.1 mm/rev
Cut amount: 2.0 mm
Cutting fluid: None The above cutting conditions correspond to high-efficiency machining of high-hardness steel.

<Cutting Evaluation 2>

A cutting test was performed under the following cutting conditions 2 using each of the cutting tools obtained above. The average wear amount Vb (mm) on the flank face side of the cutting tool after cutting for 15 minutes was measured, wherein "average wear amount" means the length determined by averaging the distance from the ridge line to the end of flank face wear. When the average wear amount Vb is 0.21 mm or less, the cutting tool is judged to have excellent wear resistance and to have a long tool life. The results are shown in the column "Cutting evaluation 2—Vb (mm)" in Table 5.

(Cutting Conditions 2)
Material to be cut: SUJ2
Machining: turning of the outer diameter of a round bar
Cutting speed: 280 m/min
Feed amount: 0.1 mm/rev
Cut amount: 2.0 mm
Cutting fluid: water-soluble cutting oil The above cutting conditions correspond to high-efficiency machining of high-hardness steel.

<Discussions>

The cutting tools of Specimens 1 to 3, Specimen 5, Specimen 7, Specimen 9, Specimen 12, Specimen 13, Specimen 15, Specimen 17, and Specimens 19 to 28 correspond to Examples. The specimens of these Examples were confirmed to have excellent fracture resistance and wear resistance and to have a long tool life. Particularly, it was confirmed that the effect of improving wear resistance was extremely excellent against such wear as flank wear that uniformly occurs.

Each of the specimens of the above Examples has the particle diameter of the $\alpha$-$Al_2O_3$ particles gradually increasing from the base material side toward the tool surface side in the region on the base material side of the $\alpha$-$Al_2O_3$ layer. Therefore, the particle diameter of the $\alpha$-$Al_2O_3$ layer near the tool surface is smaller than that of the conventional tool, but the crack propagation distance from the tool surface is long, and it is presumed that cracks in the region on the base material side of the $\alpha$-$Al_2O_3$ layer are inhibited from extending and the fracture resistance is thereby good.

Specimen 1 and Specimen 2 have the same thickness of the $\alpha$-$Al_2O_3$ layer. The average particle diameter a, the average particle diameter b and the average particle diameter c of Specimen 1 are the same as the average particle diameter a, the average particle diameter b and the average particle diameter c of Specimen 2. In Specimen 1, TC (0 0 12) is larger than TC (110). In Specimen 2, TC (110) is larger than TC (0 0 12). Specimen 1 was confirmed to be more excellent in wear resistance than Specimen 2. On the other hand, Specimen 2 was confirmed to be more excellent in fracture resistance than Specimen 1. From the above, when the thickness of the $\alpha$-$Al_2O_3$ layer and the average particle diameter a of the first region, the average particle diameter b of the second region and the average particle diameter c of the third region were the same, it was confirmed that the larger the TC (0 0 12) was, the more the wear resistance was improved whereas the larger the TC (110) was, the more the fracture resistance was improved. This tendency is also confirmed by the comparison between Specimen 10 and Specimen 11.

Specimen 4, Specimen 6, Specimen 8, Specimen 10, Specimen 11, Specimen 14, Specimen 16, Specimen 18 and Specimens 1-1 to 1-9 correspond to Comparative Examples. These Specimens had insufficient fracture resistance and/or wear resistance and had a short tool life.

Although the embodiments and Examples of the present disclosure have been described above, the configurations of the above-described embodiments and examples are contemplated from the beginning to be appropriately combined or variously modified.

The embodiments and Examples disclosed herein should be considered as exemplary and not as restrictive in all respects. The scope of the present invention is specified by the claims rather than the embodiments and examples described above, and is intended to include meanings equivalent to the claims and to include all modifications within the scope thereof.

REFERENCE SIGNS LIST 1, 21, 31, 41: cutting tool; 10: base material, 11: $\alpha$-$Al_2O_3$ layer; 12: underlayer; 13: surface layer; 14: interlayer; 15, 25, 35, 45: coating; A1: first region; A2: second region; A3: third region; P1, P3: interface; P2: surface, S1, S2, S3: virtual surface; B1: peak portion of P1; T1: bottom portion of P1; LS1: reference line; L1, L2: line.

The invention claimed is:

1. A cutting tool comprising a base material and a coating arranged on the base material; wherein:
   the coating comprises an $\alpha$-$Al_2O_3$ layer;
   the $\alpha$-$Al_2O_3$ layer is composed of a plurality of $\alpha$-$Al_2O_3$ particles;
   the $\alpha$-$Al_2O_3$ layer comprises a first region, a second region and a third region;
   the first region is a region sandwiched between an interface P1 on the base material side of the $\alpha$-$Al_2O_3$ layer and a virtual surface S1 that is located at a distance of 0.5 μm from interface P1 toward the surface side of the coating;
   the second region is a region sandwiched between virtual surface S1 and a virtual surface S2 that is located at a distance of 1.0 μm from virtual surface S1 toward the surface side of the coating;
   the third region is a region sandwiched between a surface P2 of the $\alpha$-$Al_2O_3$ layer or an interface P3 on the surface side of the coating of the $\alpha$-$Al_2O_3$ layer and a virtual surface S3 that is located at a distance of 1.0 μm from surface P2 or from interface P3 toward the base material side;
   the average particle diameter a of the $\alpha$-$Al_2O_3$ particles in the first region is 0.10 μm or more and 0.30 μm or less;
   the average particle diameter b of the $\alpha$-$Al_2O_3$ particles in the second region is 0.30 μm or more and 0.50 μm or less;
   the average particle diameter c of the $\alpha$-$Al_2O_3$ particles in the third region is 0.10 μm or more and 0.30 μm or less; and
   the ratio b/a between the average particle diameter b and the average particle diameter a is 1.5 or more and 5.0 or less.

2. The cutting tool according to claim 1, wherein the average particle diameter c is 0.16 μm or more and 0.24 μm or less.

3. The cutting tool according to claim 1, wherein the ratio b/a is 1.5 or more and 2.5 or less.

4. The cutting tool according to claim 1, wherein the average thickness of the $\alpha$-$Al_2O_3$ layer is 3 μm or more and 15 μm or less.

5. The cutting tool according to claim 1, wherein the $\alpha$-$Al_2O_3$ layer has a TC (0 0 12) of 3 or more in an orientation index TC (hkl).

* * * * *